US006402569B1

(12) United States Patent
Spadoni et al.

(10) Patent No.: US 6,402,569 B1
(45) Date of Patent: Jun. 11, 2002

(54) MOLDED BUS BAR SYSTEM

(75) Inventors: Stefano Spadoni, Dearborn; Thomas Alexander, Trenton, both of MI (US)

(73) Assignee: Alcoa Fujikura Ltd., Brentwood, TN (US)

( * ) Notice: Subject to any disclaimer, the term of this patent is extended or adjusted under 35 U.S.C. 154(b) by 0 days.

(21) Appl. No.: 09/565,543

(22) Filed: May 5, 2000

(51) Int. Cl.[7] .................... H01R 11/09; H01R 13/68; H01R 33/95
(52) U.S. Cl. .................... 439/723; 439/931; 439/949; 439/621
(58) Field of Search .................... 439/212, 715, 439/721, 723, 724, 931, 250, 944, 621

(56) References Cited

U.S. PATENT DOCUMENTS

| | | | |
|---|---|---|---|
| 4,208,645 A | * 6/1980 | Harmon et al. | 337/297 |
| 5,088,940 A | * 2/1992 | Saito | 439/621 |
| 5,229,922 A | 7/1993 | Muramatsu et al. | 361/395 |
| 5,322,445 A | * 6/1994 | Ozaki et al. | 439/212 |
| 5,427,532 A | 6/1995 | Owen et al. | 439/57 |
| 5,457,057 A | 10/1995 | Nath et al. | 437/2 |
| 5,474,475 A | * 12/1995 | Yamaguchi | 439/621 |
| 5,743,764 A | 4/1998 | Czeschka et al. | 439/607 |
| 5,749,751 A | * 5/1998 | Shortt et al. | 439/721 |
| 5,777,850 A | 7/1998 | Jakob et al. | 361/736 |
| 5,795,171 A | 8/1998 | Bernardini | 439/260 |
| 5,873,751 A | 2/1999 | Daly et al. | 439/620 |

FOREIGN PATENT DOCUMENTS

DE 9217667 6/1994 ........... B60R/16/02

* cited by examiner

*Primary Examiner*—P. Austin Bradley
*Assistant Examiner*—Edwin A. León
(74) *Attorney, Agent, or Firm*—Tracy D. Beiriger

(57) ABSTRACT

A bus bar assembly includes a first and a second bus bar plate which are maintained in a plane parallel, spaced apart relationship. Each plate includes a number of tabs projecting from its top and bottom edges. A pattern of metalization is formed on each plate, and this metalization extends to at least some of the tabs on each plate. Metalized tabs provide blade contacts which can accommodate fuses, relays or similar electrical devices. In addition, the pattern of metalization on one of the plates can be connected to an electrical circuit, and the pattern of metalization on the other plate can be connected to a source of power. In this manner, a series electrical connection between the source of power, the electrical device, and the electrical circuit can be established.

20 Claims, 2 Drawing Sheets

MOLDED BUS BAR SYSTEM

FIELD OF THE INVENTION

This invention relates to power distribution systems, particularly power distribution systems for motor vehicles. More specifically, the invention relates to bus bars used in power distribution systems and most specifically, the invention relates to a modular bus bar system which employs molded, metalized components.

BACKGROUND OF THE INVENTION

The electrical power distribution system is an important component of a wide variety of apparatus including motor vehicles, electrical appliances, industrial equipment and the like. Power distribution systems of any complexity typically include one or more bus bars which serve to carry relatively high levels of current to electrical devices such as fuses, relays and the like, from whence the electrical power is then conveyed to other components of the apparatus. The electrical systems of motor vehicles are of increasing complexity, and motor vehicles presently manufactured include an electrical distribution box having a number of bus bar assemblies therein. Presently, bus bars are fabricated from metal stampings. These bus bars are of relatively complex geometry and include a power connection terminal which is configured to engage a source of electrical power such as a battery or alternator, through a bolt or other such connection. Power bus bars further include a current carrying member having a number of connector prongs projecting there from, typically at right angles through the remainder of the assembly.

The complex geometrical shape of such bus bars precludes stacking. This, together with the general fragility of the metal stampings complicates shipping and handling. Furthermore, such prior art bus bars must be uniquely configured for each application. Therefore, in the motor vehicle industry, manufacturers are often required to employ differently configured bus bar assemblies for various models of vehicle; and in fact, a particular vehicle may require use of a number of discreetly configured bus bars. As a result, tooling and inventory problems associated with the use of prior art stamped metal bus bars are significant. In addition, prior art stamped metal bus bars are relatively heavy, and their manufacture typically generates a large amount of scrap metal which may not be easily recycled.

The present invention provides a bus bar system which allows for the assembly of bus bars of different electrical configurations from a number of standard, identical parts. The components of the system of the present invention are lightweight, rugged, and of generally planar geometry. As a result of the foregoing, problems of shipping, handling and inventory maintenance are greatly alleviated. The system of the present invention allows bus bar assemblies to be easily configured for specific applications from a relatively small number of standard components. In addition, the system of the present invention minimizes the amount of scrap generated in bus bar fabrication, and permits the ready recycling or reuse of system components. The system of the present invention has particular utility in connection with the power distribution system of motor vehicles, and will be primarily described in that context; however, it is to be understood that the bus bar system of the present invention may be used with equal advantage in power distribution systems associated with industrial equipment, home appliances, communications, equipment and the like.

The bus bar system of the present invention is based upon the use of molded, preferably, polymeric, components which are metalized, preferably by the lamination of metal foils thereonto. Metalized polymeric components have previously been employed in a number of electrical and electronic applications; however, the prior art has not recognized that metalized components can be utilized to form a power distribution bus bar system. U.S. Pat. No. 5,795,171 discloses a polymeric electrical terminal having a plated or screen-printed conductive coating thereon. U.S. Pat. No. 5,873,751, discloses a molded circuit board which includes conductive traces formed thereon, preferably through the use of a curable, electrically conductive ink. U.S. Pat. No. 5,427,532 discloses polymeric connectors which have metalized contact traces formed thereon, preferably by electroplating. U.S. Pat. No. 5,777,850 discloses the use of an electrically conductive foil in connection with a circuit board disposed in a junction box, and U.S Pat. No. 5,457,057 discloses photovoltaic modules which includes flexible photovoltaic generators having copper foil bus bars adhered thereto. None of the prior art discloses a power distribution bus system of the type described herein below, which includes an assemblage of discrete plates having conductive foil traces laminated thereto.

As will be described hereinbelow, the present invention provides a power bus system which may be assembled into a variety of configurations, utilizing standard components. The system of the present invention is readily adaptable to modular power distribution systems, and has significant utility in complex power distribution systems of the type utilized in motor vehicles, industrial equipment, electrical appliances and the like. These and other advantages of the invention will be apparent from the discussion, description and drawings which follow.

BRIEF DESCRIPTION OF THE INVENTION

There is disclosed herein a bus bar assembly for establishing electrical communication between a power supply, an electrical device, and an electrical circuit. The assembly of the present invention includes a first and a second bus bar plate. Each plate is a generally planar member fabricated from an electrically insulating material, such as an injection molder polymer. Each plate has at least one contact tab defined on an edge thereon. The tab projects from the edge and is coplanar with the remainder of the plate. A pattern of electrically conductive material, preferably a thermally embossed metal foil is disposed on a portion of each plate so that the conductive pattern extends onto, and covers at least some of the contact tab of each plate. The first plate includes a connector for establishing electrical communication between a battery or other source of electrical power and the conductive pattern on the plates so that the power can be conveyed to the contact tab. The second plate includes means for connecting an electrical circuit to the conductive pattern on that second plate. The connector means may comprise a connector tab projecting from the second plate. A spacer allows the plates to be secured to one another in a plane parallel relationship so that the conductive patterns on the plates are in a spaced-apart relationship. The spacer, in one embodiment, includes molded-in components on the plates such as pins and sockets.

In the assembly of the present invention, the contact tab of the first plate, and the contact tab of the second plate are configured to engage respective terminals of a fuse or other such electrical device. In this manner, an electrical device which is secured to the contact tabs bridges the first and second conductive patterns and allows for the flow of electrical current from the power supply to the remainder of an electrical circuit which is connected to the conductive pattern on the second plate. In specific embodiments, the plates include a plurality of contact tabs, and they can further include a number of connector tabs which have the conductive pattern extending thereonto. The connector tabs are employed to establish electrical connection to the remainder of an electrical circuit. In specific embodiments, the connective pattern is formed from a copper metal foil. In specific embodiments, the plates are formed from an injection-molded thermoplastic material, which is a high-strength nylon or the like.

Also disclosed herein are methods for the fabrication and use of the bus bar assemblies.

DETAILED DESCRIPTION OF PREFERRED EMBODIMENTS

Figure 1:
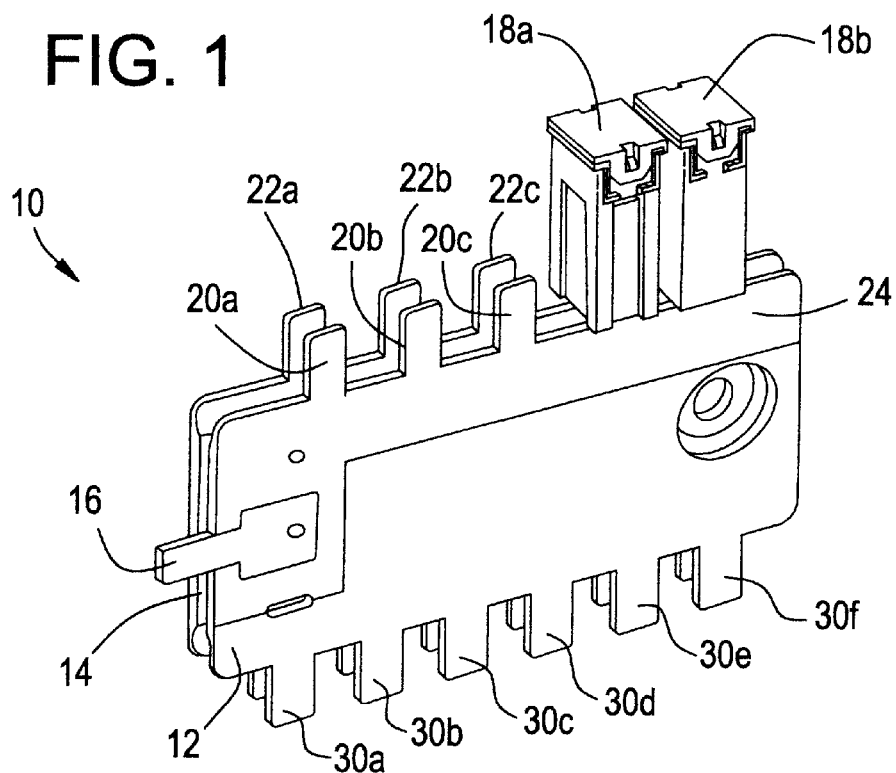
FIG. 1 is a perspective view of a bus bar assembly of the present invention taken from the side of the first plate thereof.

FIG. 1 is a perspective view of one embodiment of bus bar assembly 10 structured in accord with the principles of the present invention. Bus bar assembly 10 of FIG. 1 includes a first bus bar plate 12 and a second bus bar plate 14 disposed in a spaced apart generally plane parallel relationship. The bus bar assembly 10 functions to convey electrical power from a terminal 16, to one or more electrical circuits via one or more electrical devices, which in this instance are depicted as automotive fuses 18a and 18b of the type known in the art as J-type fuses.

The plates 12, 14, of the bus bar assembly 10 each include a number of contact tabs projecting from an upper edge thereof. As shown in FIG. 1, the first bus bar plate 12 includes contact tabs 20a, 20b, and 20c and the second plate 14 includes contact tabs 22a, 22b, and 22c. Other tabs are covered by the fuses 18a, 18b. A pattern of electrically conductive material is disposed on each plate, and this pattern covers at least a portion of at least some of the contact tabs 20, 22. As shown in FIG. 1, the pattern of electrically conductive material 24 extends so as to cover all of the depicted contact tabs, 20a, 20b and 20c, as well as contact tabs which are covered by the fuses 18a, 18b. The conductive pattern 24 shown in FIG. 1 also is an electrical contact with the power connection terminal 16.

Figure 2:
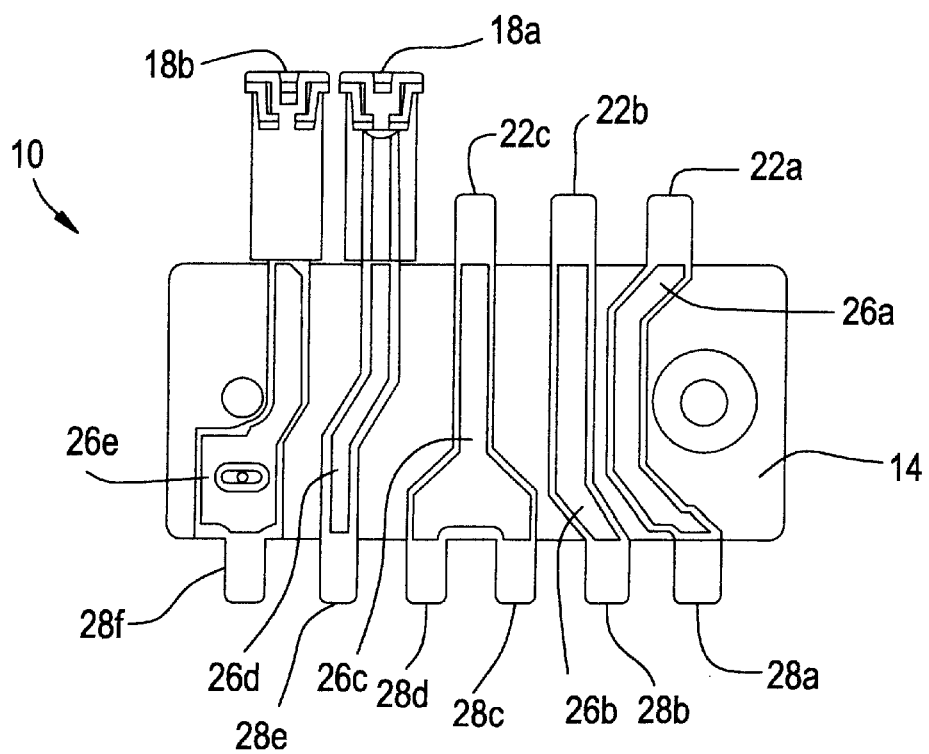
FIG. 2 is a plan view of the bus bar assembly of FIG. 1 taken from the side of the second plate thereof.

Referring now to FIG. 2, there is shown a plan view of the bus bar assembly 10 of FIG. 1 taken from the side of the second plate 14. As shown in FIG. 2, the second plate 14 has an electrically conductive pattern 26 formed thereon. In this case, the pattern 26 is comprised of five separate segments, 26a–26e. The pattern covers the contact tabs 22a, 22b, 22c of the second plate 14. The pattern also covers two other contact tabs which, in this Figure, are not visible since they are engaged by fuses 18a, 18b.

The conductive pattern on the second plate 14 also extends so as to cover a set of connector tabs 28a–28f which project from a bottom edge of the plate 14. As depicted, the conductive pattern establishes an electrical connection between various of the contact tabs 22 and the connector tabs 28. As illustrated, the conductive pattern can establish contact between one contact tab and connector tab, as for example, between tabs 22a and 28a. Likewise, the conductive pattern can establish electrical communication between more than one pair of tabs. For example, the segment of the pattern 26c establishes electrical communication between contact tab 22c and connector tabs 28c and 28b. Still other configurations are possible within the context of this invention.

The connector tabs 28 are used to establish electrical contact with one or more electrical circuits. As illustrated, connector tabs 28 form blade terminals which can engage a corresponding socket. Other configurations of connector means are also possible within the context of this invention. For example, the connector tabs 28 can provide points for soldered contacts to be made, or they can provide points for the affixation of variously configured connector terminals by means of rivets, bolts, or the like. In yet other embodiments of the present invention, the connector tab 28 may be eliminated or otherwise configured, and connector terminals such as pin connectors, socket connectors, frictional connectors, or the like may be incorporated onto or into the plate 14 to provide means for connecting an electrical circuit.

Referring back to FIG. 1, it will be noted that the first plate 14 also includes a set of connector tabs 30a–30f projecting therefrom; however, in this particular embodiment of the invention, no conductive pattern extends to these tabs. However, it is to be understood that in some embodiments, these tabs may have a conducting pattern extending thereon to so as to be functional for providing power to a circuit connected thereto.

The bus bar assembly of FIGS. 1 and 2 is particularly well suited for use in a power distribution box of a motor vehicle. As illustrated, the bus bar assembly provides a support for a number of fuses, for example, fuses 18a and 18b, and allows these fuses to be connected to electrical circuits supplying power to various components of the vehicle. It should be noted that as illustrated, only two fuses 18a and 18b are shown as affixed to the assembly. In most practicable applications, electrical devices will be affixed to all of the contact tabs. Also, while the bus bar is illustrated as used in connection with fuses, it may likewise be used to establish electrical path which includes resistors, relays, diodes, switches, or any other electrical device.

In the operation of the bus bar 10 of FIGS. 1 and 2, electrical power is supplied to the power terminal 16, as for example, by connection of the terminal 16 to a battery or alternator. Electrical current flows through the conductive pattern 24 on the first plate 12, to the contact tabs 20 of the first plate. It flows through the electrical device, for example, fuse 18a, to a corresponding contact tab 22 on the second plate 14, and from thence to a connector tab associated therewith, in this instance, tab 28e. In this manner, the fuse element 18a is inserted in series in an electrical circuit established between the power terminal 16 and electrical system coupled to connector tab 28e.

In a preferred embodiment of the invention, the pattern of electrically conductive material is formed from a metal foil which is thermally laminated onto the respective bus bar plates 12, 14. Lamination may be accomplished by a combination of heat and pressure. In some instances, an adhesive may be employed to assure that the foil is retained in contact with the plate; although, in those instances where the plate is formed from a relatively thermoplastic material itself, lamination may be accomplished by heat and pressure, without the use of any additional adhesive. One metal foil having particularly utility in the present invention is a material sold under the designation Ivotape® by the Cusolar Corporation of Chesterfield, Mich. This particular product comprises an electrically conductive metal foil tape which can be hot embossed or stamped onto thermoplastic materials. In a most preferred embodiment, the tape is a copper foil tape having a thickness in the range of 10–150 microns. In specific instances, the tape is a copper tape having a thickness in the range of 35 to 100 microns. The tape may include a coating which facilitates bonding. In some instances, the coating is a hot-melt adhesive coating; however, one particularly preferred coating comprises a carbon coating, an oxide coating, or a combination of carbon and oxide. In some instances, the copper foil is provided with a nickel, a tin or gold-plated layer thereatop to enhance solderability and/or and environmental integrity. Other metal foils such as nickel foil, gold foil, and the like may be employed in particular applications. In one preferred embodiment, the foil is stamped and embossed in a single step utilizing a heated die which severs the foil along predetermined lines, and simultaneously embosses the foil onto bus bar plates.

While the metal foil comprises a preferred material for fabrication of the electrically conductive pattern, other materials such as conductive inks may be likewise employed. Also, plating processes or other metalization processes such as thermo-chemical deposition may be employed to form the conductive pattern.

The bus bar plates can be fabricated from any electrically insulating material which is capable of having the metallic patterns formed or applied thereto, and which has sufficient strength and integrity to function for this application. The polymers, particularly high-strength engineering polymers are some of the preferred materials for the practice of the present invention. One particularly preferred material comprises nylon 66. Other preferred polymeric materials comprise ABS polymers, and composite materials such glass or fiber-filled polymers. Most preferably, the plates are fabricated from an injection moldable thermoplastic material.

Figure 3:
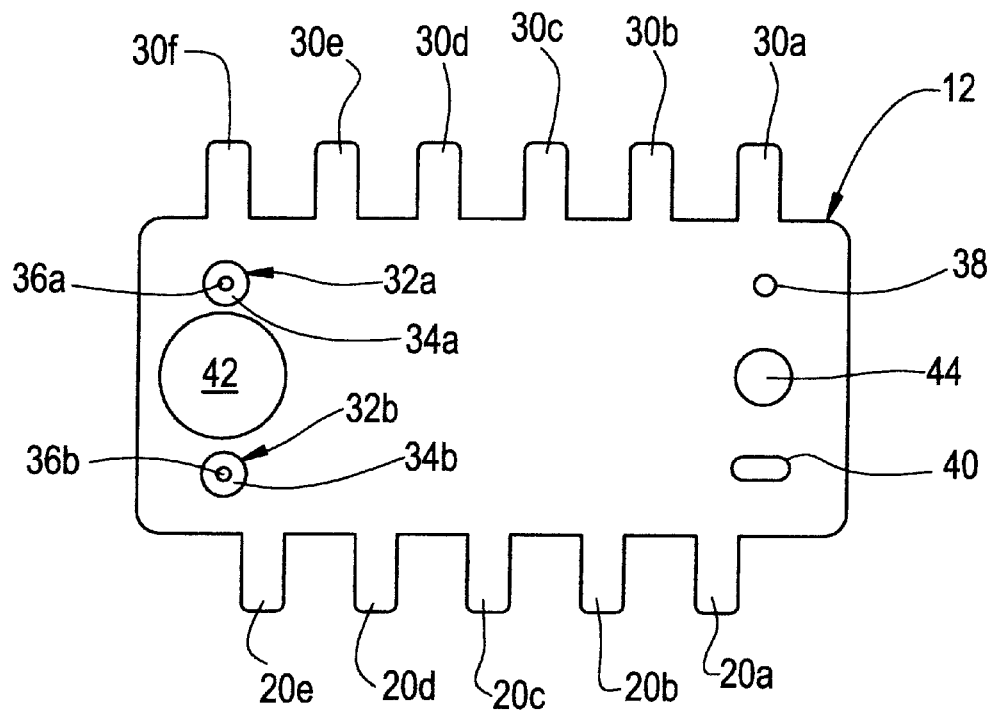
FIG. 3 is a plan view of a bus bar plate which may be employed in the practice of the present invention, showing the first face thereof.
Figure 4:
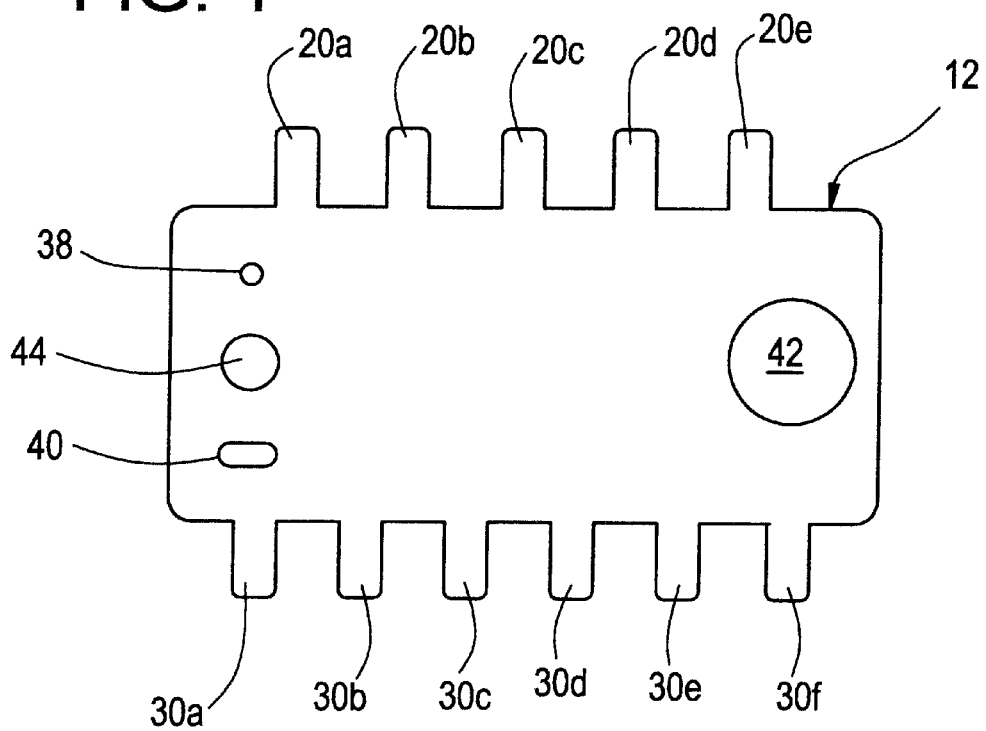
FIG. 4 is a plan view of the bus bar plate of FIG. 3 showing a second face thereof.

Referring now to FIGS. 3 and 4, there are shown plan views of first and second face of an unmetalized bus bar plate, which may be employed in the practice of the present invention. FIG. 3 depicts the first face of a typical plate 12. In the assembly shown in FIG. 1, this face would be the inside face, that is to say the face directed towards the second plate 14. As will be seen from FIG. 3, the plate 12 includes contact tabs 20a–20e, and connector tabs 30a–30f. The plate 12 further include spacers, 32a, 32b which are integrally molded therein. Each spacer includes a collar portion 34a, 34b. These collar portions are of a first diameter, and are disposed directly upon the face of the plate 12. Each spacer 32 further includes a pin portion, 36a, 36b. Pin portions 36 project from the collar portions 34. In the illustrated embodiment, the length dimension of the plate is approximately 9 centimeters, and the width dimension, exclusive of the tabs, is approximately 4 centimeters. Height of the collar portion 34 is approximately 1–2 millimeters, and the length of the pin 36, approximately 2–4 millimeters. The plate 12 further includes a first socket 38 and a second socket 40 defined therethrough. The sockets 38, 40 are of a size configured to receive the pins 36 of a corresponding plate. It will be noted that as illustrated, socket 38 is configured as a hole and socket 40 as a slot. The plate further includes a first, relatively large hole defined therethrough 42 and a second, relatively smaller hole 44 defined therethrough.

FIG. 4 depicts the same plate 12 as viewed from the second face thereof, which face in a typical application, bears the conductive pattern thereon. Shown in FIG. 4 are the contact tabs 20, connector tabs 30, the large opening 42 and the small opening 44, as well as the openings 38 and 40 which receive the spacer pins 36.

It is a notable feature of the present invention that the bus bar assembly may be implemented utilizing two identical members as the first and second plates. For example, a pair of plates, generally similar to those shown in FIGS. 3 and 4 can be disposed in a face-to-face relationship so that first faces thereof are closest to one another, and so that the spacer pins 36 of a first plate fit into the spacer pins sockets 38, 40 of a like second plate. In this regard, the slotting of the second socket 40 facilitates alignment and assembly. When the plates are thus assembled, the large hole 42 of one plate will be superimposed over the small hole 42 of corresponding plates, and the plates will be maintained in a spaced apart, generally plane parallel relationship by means of the collars 34 of the spacers 32. The superimposed holes 42 and 44 permit a bolt or other fastener to be passed between the plates so as to fixedly join the plates. In addition, this bolt can be used to secure a power connect terminal to at least one of the plates, as illustrated in FIG. 1. Depending on the particular application, either one or both 42, 44 can be used in this manner. It is to be understood that the plates may be otherwise fastened together. For example, adhesive may be employed to join the plates together, or the pins 36, 38 may be configured to provide a positive retention. As explained above, the spaced apart plates provide paired contact and connector tabs which may be employed as discussed above.

Yet other configurations of the present invention may be implemented. For example, the plates may be made larger or smaller, and the number and placement of the tabs varied. In some instances, the tabs may be configured so that unneeded tabs can be snapped off. In other instances, the spacer can be a separate member. For example, a spacer washer may be inserted between the plates and fastened with a bolt or other such member which passes through the pair of plates.

In some instances, the bus bar plates of the present invention may be fabricated as an extended body of material which can be broken or cut to a length as needed. In such instance, it will be appreciated that a single body of stock material can be configured to form bus bar assemblies of different lengths. In yet other instances, a plurality of first plate members, and a plurality of second plate members can be joined together in a staggered relationship so that a portion of two separate first plate members overlays, and is spaced from a single second plate member, so that the tabs of the first plate member, and the second plate member are aligned. In this manner, a large number of plates may be joined together to form a relatively long bus bar assembly. There are other modifications and variations which will be readily apparent to one of skill in the art.

The bus bar assembly of the present invention will thus be seen to provide a bus bar system which can be assembled into a plurality of different configurations. The assembly of the present invention readily lends itself to the fabrication of modular power distribution systems and eliminates the need for a manufacturer to stock a large number of specifically configured bus bar members. The bar plates of the present invention can readily be produced in various custom lengths through the use of modular tooling. The bus assemblies can be customized for specific current requirements by selecting the size and thickness of the current carrying metal foil patterns. Because of the configuration of the bus bar assembly of the present invention, surface-mounted devices such as diodes, relays and the like can be directly incorporated onto the bus bar plates thereby decreasing the size and complexity of a power distribution system.

In view of the disclosure and discussion presented herein, it will be apparent to one of skill in the art that numerous other modifications and variations of the present invention may be implemented. The foregoing drawings and descriptions are illustrative of particular embodiments of the invention, but are not meant to be limitations upon the practice thereof. It is the following claims, including all equivalents, which define the scope of the invention.

What is claimed is:

1. A bus bar assembly for establishing electrical communication between a power supply, an electrical device, and an electrical circuit, said assembly comprising:

a first bus bar plate and a second bus bar plate, each plate comprising a generally planar member fabricated from an electrically insulating material, and each having at least one contact tab defined thereon so as to project from a selected edge of each plate, and to be coplanar therewith;

a first pattern of electrically conductive material disposed on a portion of said first plate, and a second pattern of an electrically conductive material disposed on a portion of said second plate, each conductive pattern covering at least a portion of said at least one contact tab on its respective plate;

means for connecting a source of electrical power to the first conductive pattern and comprising a power terminal in electrical communication with said first conductive pattern;

means for connecting an electrical circuit to the second conductive pattern and comprising at least one connector tab defined so as to project from a her selected edge of said second plate, at least a portion of said second conductive pattern of material extending to said at least one connector tab;

a spacer extending between opposing faces of said plates and for positionally maintaining said first and second plates relative to one another so that the first and second conductive patterns are in an electrically isolated, spaced apart, plane parallel relationship, and the first conductive pattern on the contact tab of the first plate provides a first contact member for establishing electrical communication with a first terminal of an electrical device, and the second conductive pattern on the contact tab of the second plate provides a second contact member for establishing electrical communication with a second terminal of said electrical device;

whereby said bus bar assembly provides a path for an electrical current to flow from the source of electrical power, through said first conductive pattern, through an electrical device which is in electrical communication with the first and second contact members, and through said second conductive pattern to said electrical circuit.

2. The bus bar assembly of claim 1, wherein said first and second bus bar plates each include a plurality of contact tabs defined thereon, and wherein the first and second electrically conductive patterns each cover a portion of at least some of the members of said plurality of contact tabs on their respective plates.

3. The bus bar assembly of claim 1, wherein said connector tab is configured to engage an electrical connector socket associated with said electrical circuit.

4. The bus bar assembly of claim 1, wherein said first and second electrically conductive patterns are formed from a metal foil.

5. The bus bar assembly of claim 4, wherein said metal foil comprises a copper foil.

6. The bus bar assembly of claim 4, wherein said metal foil has been thermally laminated to said bus bar plates.

7. The bus bar assembly of claim 1 further including a power-feed bolt which passes through said second plate and said first plate and secures said power terminal to said first plate in electrical contact with said first conductive pattern.

8. The bus bar assembly of claim 7, wherein said spacer includes a washer disposed between said first and second plates so that said bolt passes therethrough.

9. The bus bar assembly of claim 1, wherein said spacer comprises a member which is integral with one of said plates.

10. The bus bar assembly of claim 9, wherein said spacer includes a pin which projects from one of said plates so as to be engageable with a socket formed in the other of said plates.

11. The bus bar assembly as in claim 1, wherein said bus bar plates are fabricated from an injection molded thermoplastic.

12. The bus bar assembly of claim 11, wherein said thermoplastic comprises a member selected from the group consisting of: nylon, ABS, and combinations thereof.

13. The bus bar assembly as in claim 1, wherein said second conductive pattern is comprised of a plurality of segments.

14. The bus bar assembly of claim 13, wherein first and second contact patterns are formed from a metal foil.

15. A bus bar assembly for establishing electrical communication between a power supply, an electrical device, and an electrical circuit, said assembly comprising:

a first and second bus bar plate, each plate comprising a generally planar member fabricated from an electrically insulating material, each plate having a first plurality of contact tabs defined thereon so as to project from a first edge of the plate, and a second plurality of connector tabs defined thereon so as to project from a second edge of the plate, and to be coplanar therewith, each plate further including a spacer pin disposed on a first face of said plate so as to project therefrom, and a socket defined in said first face, said spacer pin and socket being disposed so that when the spacer pin of first plate is fitted into the socket of the second plate, the spacer pin of second plate will fit into the socket of the first plate, whereby said spacer pins and sockets cooperate to maintain said plates in a spaced apart relationship;

a first pattern of an electrically conductive material disposed on a portion of said first plate, said first conductive pattern covering at least a portion at least some of said plurality of contact tabs on said first plate, said first conductive pattern further defining a terminal contact area on said first plate;

a second pattern of an electrically conductive material disposed on a portion of said second plate, said second conductive pattern covering at least a portion of at least some of said plurality of contact tabs on said second plate, and at least a portion of, at least some of said plurality of connector tabs on said second plate so as to establish electrical communication between selected ones of said plurality of contact tabs and selected ones of said plurality of said connector tabs;

whereby when the respective spacer pins end sockets of said plates are engaged so as to maintain said plates in a spaced apart relationship, the contact tabs of said first plate, and the contact tabs of said second plate are in a spaced apart, plane parallel relationship and can engage corresponding socket terminals of an electrical device so that the path for the flow of electrical current is established from the determined contact area of said first plate, through the first conductive pattern, to at least one of said connector tabs of said first plate, through said electrical device, to a contact tab of said second plate, and through the second conductive pattern, to a connector tab of said second plate.

16. A bus bar assembly as in claim 15, wherein said metal foil comprises a metal foil which has been thermally laminated to said bus bar plates.

17. The bus bar assembly of claim 15, wherein said metal foil is a copper foil having a thickness in the range of 10–150 microns.

18. The bus bar assembly of claim 16, wherein said foil has a thickness in the range of 35–100 microns.

19. A method for manufacturing a bus bar assembly operative to establish electrical communication between a power supply, an electrical device, and an electrical circuit, said method comprising the steps of:

provided a first and second bus bar plate, each plate comprising a generally planar member fabricated from an electrically insulating material, and each having a contact tab defined thereon so as to project from an edge of the plate and be coplanar therewith;

forming a pattern of an electrically conductive material on a portion of each plate, said conductive pattern covering at least a portion of the contact tab of each plate;

providing spacer means for positionally maintaining said first and second plates relative to one another so that the conductive patterns on said first and second plates are in an electrically isolated, spaced apart, plane parallel relationship and the conductive pattern on the contact tab of the first plate provides a first contact member for establishing electrical communication with a first terminal of an electrical device and the conductive pattern on the contact tab of the second plate provides a second contact member for establishing electrical communication with a second terminal of said electrical device;

providing a connector for establishing electrical communication between a source of electrical power and the conductive pattern on said first plate; whereby said bus bar assembly provides a path for an electrical current to flow from the source of electrical power through the conductive pattern on the first plate, through said electrical device and through the conductive pattern on the second plate to an electrical circuit in electrical communication with the conductive pattern on the second plate.

20. A bus bar assembly for use in a power distribution box of a motor vehicle for establishing electrical communication between a power supply, electrical device and electrical circuit, said bus bar assembly comprising:

a first bus bar plate and a second bus bar plate, each being fabricated from an electrically insulating material and having a specified length, width and thickness so as to define first and second opposite faces with first and second extending edges;

first pluralities of contact tabs extending in coplanar fashion from said first extending edges of said plates;

second pluralities of connector tabs extending in coplanar fashion from said second extending edges of said plates;

first and second patterns of conductive material being disposed on selected portions of at least one selected face of said first and second plates;

a power terminal extending from said first plate, in electrical communication with said first pattern of conductive material and communicating electrical power with said first conductive pattern;

said patterns of conductive material further extending to selected ones of said first and second pluralities of connector tabs for establishing electrical communication with first and second associated terminals of the electrical device;

at least one spacer extending between further selected and opposing faces of said plates, said spacers positionally maintaining said first and second plates in an electrically isolated, spaced apart and parallel relationship.

* * * * *

UNITED STATES PATENT AND TRADEMARK OFFICE
CERTIFICATE OF CORRECTION

PATENT NO.    : 6,402,569 B1
DATED         : June 11, 2002
INVENTOR(S)   : Stefano Spadoni et al.

It is certified that error appears in the above-identified patent and that said Letters Patent is hereby corrected as shown below:

<u>Column 7,</u>
Line 34, insert -- further -- delete "her".

Signed and Sealed this

Twenty-fifth Day of October, 2005

JON W. DUDAS
*Director of the United States Patent and Trademark Office*